(12) United States Patent
Nakamura et al.

(10) Patent No.: US 8,882,096 B2
(45) Date of Patent: Nov. 11, 2014

(54) PERFORATED SUPPORT PLATE

(71) Applicant: Tokyo Ohka Kogyo Co., Ltd., Kanagawa (JP)

(72) Inventors: Akihiko Nakamura, Kanagawa (JP); Atsushi Miyanari, Kanagawa (JP); Yoshihiro Inao, Kanagawa (JP); Yasumasa Iwata, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 13/939,524

(22) Filed: Jul. 11, 2013

(65) Prior Publication Data

US 2013/0333833 A1 Dec. 19, 2013

Related U.S. Application Data

(62) Division of application No. 12/448,499, filed as application No. PCT/JP2007/001295 on Nov. 26, 2007.

(30) Foreign Application Priority Data

Dec. 28, 2006 (JP) ................................. 2006-355508

(51) Int. Cl.
| | | |
|---|---|---|
| *B23Q 7/00* | (2006.01) | |
| *H01L 21/02* | (2006.01) | |
| *H01L 21/687* | (2006.01) | |
| *H01L 21/67* | (2006.01) | |

(52) U.S. Cl.
CPC ..... *H01L 21/02002* (2013.01); *H01L 21/67132* (2013.01); *H01L 21/68757* (2013.01)
USPC ...................................... 269/289 R; 295/559

(58) Field of Classification Search
USPC ........... 438/17, 18, 464; 269/289 R; 156/344, 156/584, 578, 703, 345.51, 228, 285; 428/596, 131
See application file for complete search history.

(56) References Cited

U.S. PATENT DOCUMENTS

| | | | |
|---|---|---|---|
| 5,298,337 | A | 3/1994 | Hendricks |
| 6,943,045 | B2 | 9/2005 | Kitamura et al. |
| 7,268,061 | B2 | 9/2007 | Miyanari et al. |
| 2004/0235269 | A1 | 11/2004 | Kitamura et al. |
| 2005/0170612 | A1 | 8/2005 | Miyanari et al. |
| 2005/0173064 | A1* | 8/2005 | Miyanari ...................... 156/344 |
| 2006/0141412 | A1 | 6/2006 | Masten et al. |

FOREIGN PATENT DOCUMENTS

| | | |
|---|---|---|
| JP | 2000-195878 | 7/2000 |
| JP | 2004-140227 | 5/2004 |
| JP | 2005-191550 | 7/2005 |

OTHER PUBLICATIONS

International Search Report issued Dec. 18, 2007 in the International (PCT) Application of which the present application is the U.S. National Stage.
Japanese Office Action (with English translation) issued Nov. 22, 2011 in corresponding Japanese Application No. 2006-355508.
Taiwanese Office Action (with English translation) issued Dec. 7, 2011 in corresponding Taiwanese Application No. 096149765.
Taiwanese Office Action issued Jun. 20, 2012 in corresponding Taiwanese Application No. 096149765 (with partial English translation).

* cited by examiner

*Primary Examiner* — Lee D Wilson
*Assistant Examiner* — Jamal Daniel
(74) *Attorney, Agent, or Firm* — Wenderoth, Lind & Ponack, L.L.P.

(57) ABSTRACT

To provide a perforated support plate with high rigidity, the perforated support plate for supporting a surface of a wafer by interposing an adhesive layer comprises a reinforcing part for deflection prevention.

16 Claims, 8 Drawing Sheets

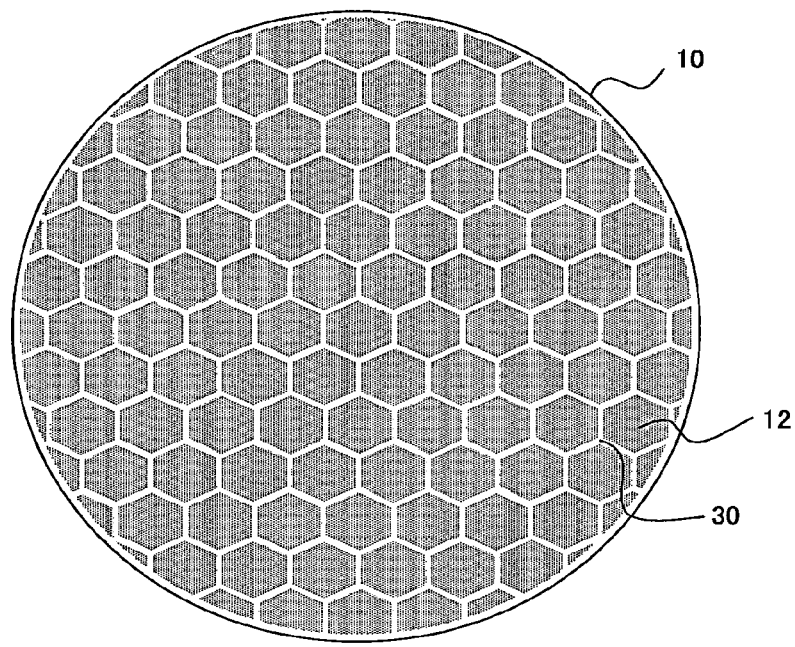
F I G. 4

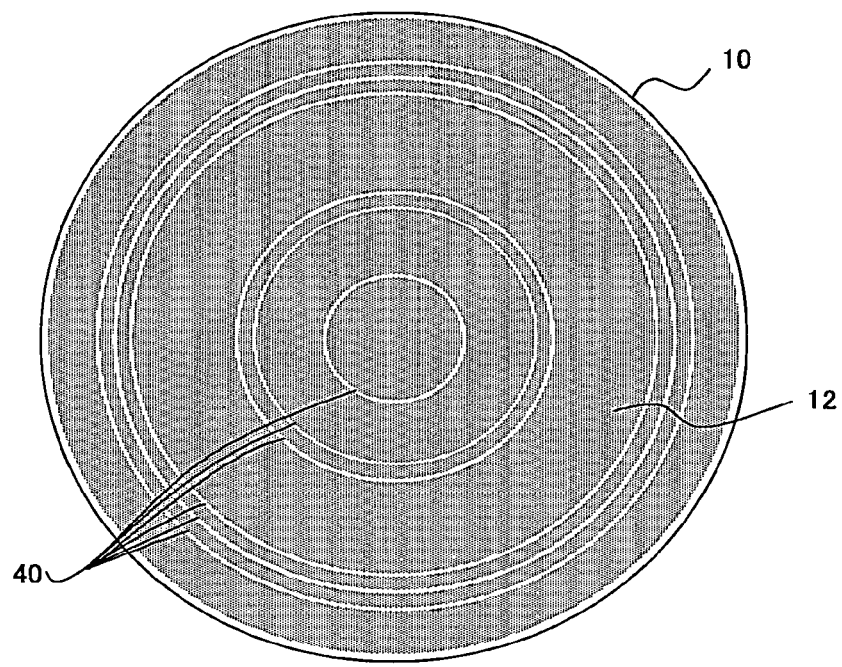
F I G. 5

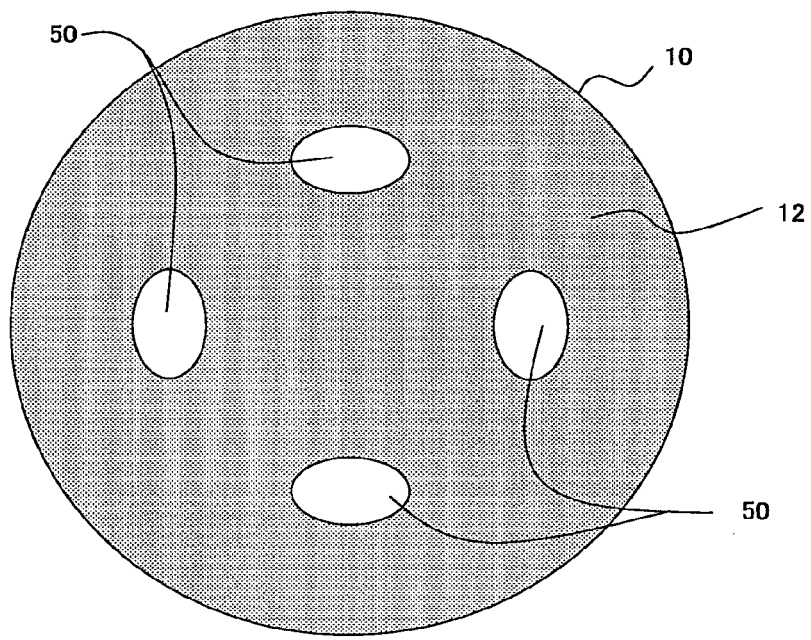
F I G. 6

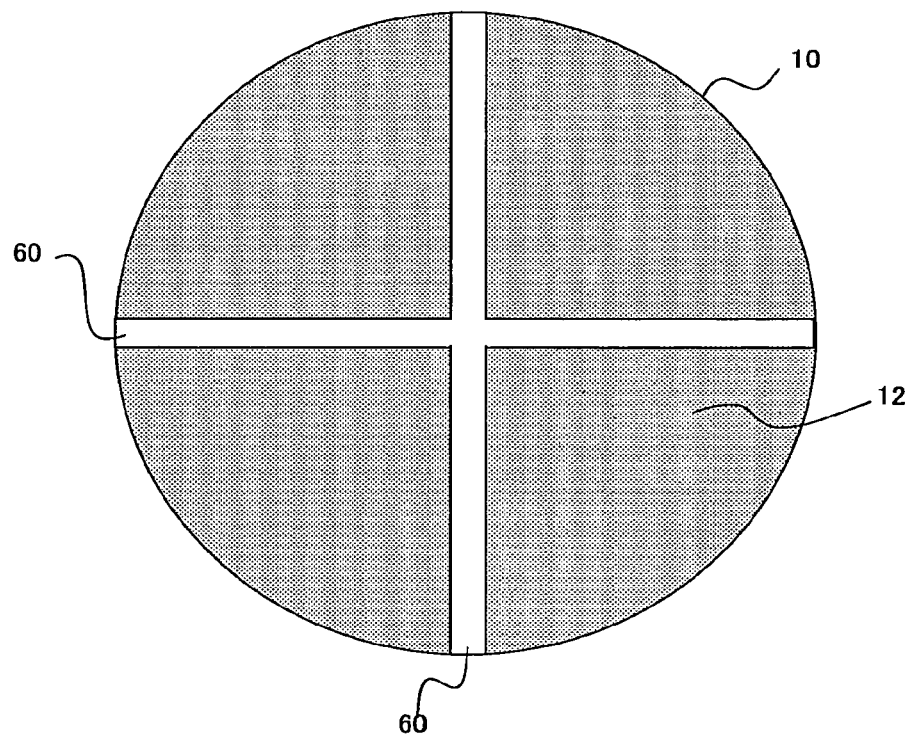
F I G. 7

PERFORATED SUPPORT PLATE

TECHNICAL FIELD

The present invention relates to a support plate for supporting a wafer, and more particularly, to a support plate having penetration holes (referred to as a perforated support plate in this specification).

BACKGROUND ART

In recent years, attention has been focused on the development of thinning a wafer as the demand for further integrating an IC chip and shrinking its package is increasing. If a wafer is thinned to a certain extent, a deflection occurs on the entire surface with degradation in the strength of a surface, and the wafer must be supported by another support member when being handled. Accordingly, a wafer to be thinned to a certain extent is handled after the strength of the surface is reinforced by being pasted with a support plate made of glass, a nickel-iron alloy, or the like in advance as the support member. The pasting of the support plate to the wafer is made by interposing a substance having an adhesive property (such as an adhesive agent, etc.) between the wafer and the support plate. Moreover, peeling of the support plate from the wafer is made by dissolving the above described substance with a solvent. This solvent is guided to the above described substance by immersing the wafer and the support plate within the solvent.

In recent years, a support plate on which many minute penetration holes for guiding the solvent between the wafer and the support plate are provided in the thickness direction of the support plate, namely, a perforated support plate is widely used as the above described support plate in order to make the solvent react with the above described substance in a short time. The penetration holes are sometimes structured to be unopened so that a glass substance is partially left to be opened later especially on a glass support plate. Such many penetration holes are arranged on the support plate almost evenly with high density over the entire range to which the wafer is pasted.

A configuration of the support plate that is made of an iron-nickel alloy and includes penetration holes is disclosed by Patent Document 1.

Patent Document 1: Japanese Laid-open Patent Publication No. 2005-191550

To reinforce the strength of the surface of the wafer to be thinned, a glass support plate of 0.7 mm in thickness is used.

For the above described glass support plate of 0.7 mm in thickness, on which many penetration holes for running a solvent are arranged, all the penetration holes are evenly arranged at a high density within the entire area except for the edge of the perforated support plate and its neighboring area. Accordingly, the solvent is efficiently guided to the entire surface pasted to the wafer through the penetration holes, and the substance having the adhesive property interposed between the wafer and the perforated support plate may be made to quickly react so as to peel the support plate from the wafer in a short time.

In recent years, however, the diameter of a perforated support plate has been demanded to increase to 300 mm or more as the diameter of a wafer is increasing to 300 mm or more. Compared with a general support plate that does not include penetration holes for running a solvent, the perforated support plate is lacking in a substance configuring a base material by an amount corresponding to the penetration holes, leading to a low rigidity. For conventional support plates of small diameters, a certain degree of strength can be secured. However, for perforated support plates of 300 mm or more in diameter and 0.7 mm in thickness, the above described certain degree of strength cannot be secured due to the lack of rigidity, leading to a deflection. Namely, the conventional perforated support plates cannot prevent a wafer from deflecting if it increases in diameter and deflects.

To avoid the above described problem, a support plate processed by thinning a glass plate base material of 1 mm in thickness to be 0.8 mm is conventionally used as a perforated support plate of a large diameter of 300 mm or more. In such a case, however, a plate base material of 1 mm in thickness must be shaved to 0.8 mm. Therefore, the number of process steps increases in comparison with the case where the glass plate base material of 0.7 mm in thickness is used unchanged.

Moreover, the thickness of a perforated support plate of a large diameter of 300 mm or more is different from that of a perforated support plate of a smaller diameter. Accordingly, components for respective thicknesses must be provided to handle perforated support plates of different thicknesses for each device handling perforated support plates (such as a pasting device, a peeling device, etc.), leading to an increase in the number of components or the size of the device.

DISCLOSURE OF INVENTION

A perforated support plate deflects if it increases in diameter, and a wafer cannot be prevented from deflecting as a result. Therefore, a perforated support plate with high rigidity is provided by arranging a reinforcing part for deflection prevention on the perforated support plate for supporting a surface of a wafer by interposing an adhesive layer.

It is preferable to arrange the reinforcing part for deflection prevention as a no-hole area for deflection prevention that is formed on a plate base material and configured with a line of a geometric pattern. For example, if the perforated support plate is configured by using a plate glass material as a base material, the above described reinforcing part for deflection prevention is arranged on the plate glass material as a no-hole area for deflection prevention configured with a line of a geometric pattern.

Additionally, it is preferable that the geometric pattern is configured with a plurality of concentric circles, line extending radially, or a repetition of the same graphic.

Furthermore, it is preferable that the line width of the geometric pattern is 1 mm or less. Still further, an unopened area for suction for a vacuum suction device may be provided on the perforated support plate.

Still further, it is preferable that the perforated support plate is approximately 300 mm in diameter and is 0.7 mm or less in thickness.

According to the present invention, a reinforcing part for deflection prevention is comprised. Therefore, the rigidity of the perforated support plate can be increased.

Additionally, if the reinforcing part for deflection prevention is arranged on a plate base material as a no-hole area for deflection prevention configured with a line of a geometric pattern, the thickness of the perforated support plate can be made identical to that of the plate base material.

Furthermore, if the geometric pattern is configured with a plurality of concentric circles, lines extending radially, or a repetition of the same graphic, the strength of the surface can be efficiently increased over the wide range of the perforated support plate.

Still further, by implementing the line width of the geometric pattern to be 1 mm or less, a difference between a pitch of penetration holes and a pitch of penetration holes adjacent via the reinforcing part for deflection prevention is reduced.

Therefore, the time required to peel the perforated support plate from the wafer, which is increased by arranging the reinforcing part for deflection prevention, can be decreased.

Still further, a sucking property when a vacuum suction device is used can be also improved by arranging an unopened area for suction.

Especially, a perforated support plate of 300 mm or more in diameter and 0.7 mm in thickness can be prevented from deflecting by improving the rigidity, whereby availability as a perforated support plate is improved.

BRIEF DESCRIPTION OF DRAWINGS

FIG. 4 is a schematic diagram (No. 1) illustrating a modification example of a line of a geometric pattern in a no-hole area for deflection prevention;

FIG. 5 is a schematic diagram (No. 2) illustrating a modification example of the line of the geometric pattern in the no-hole area for deflection prevention;

FIG. 6 is a schematic diagram (No. 1) illustrating a modification example of the shape of an unopened area for suction;

FIG. 7 is a schematic diagram (No. 2) illustrating a modification example of the shape of the unopened area for suction.

BEST MODE OF CARRYING OUT THE INVENTION

Embodiments according to the present invention are described in detail below with reference to the drawings.
(First Embodiment)

Figure 1A:
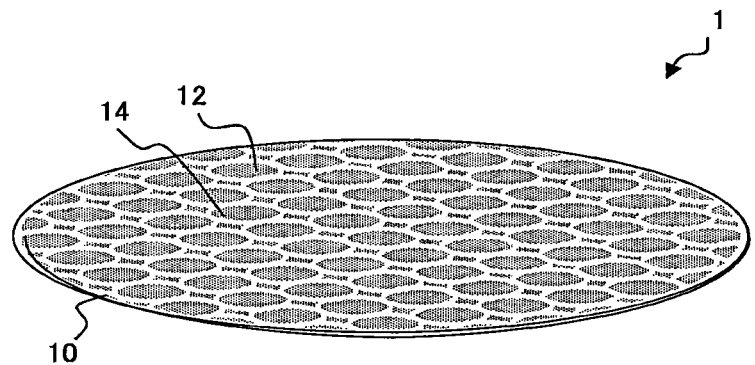
FIGS. 1A and 1B are explanatory views of a perforated support plate in a first embodiment of the present invention.
Figure 1B:
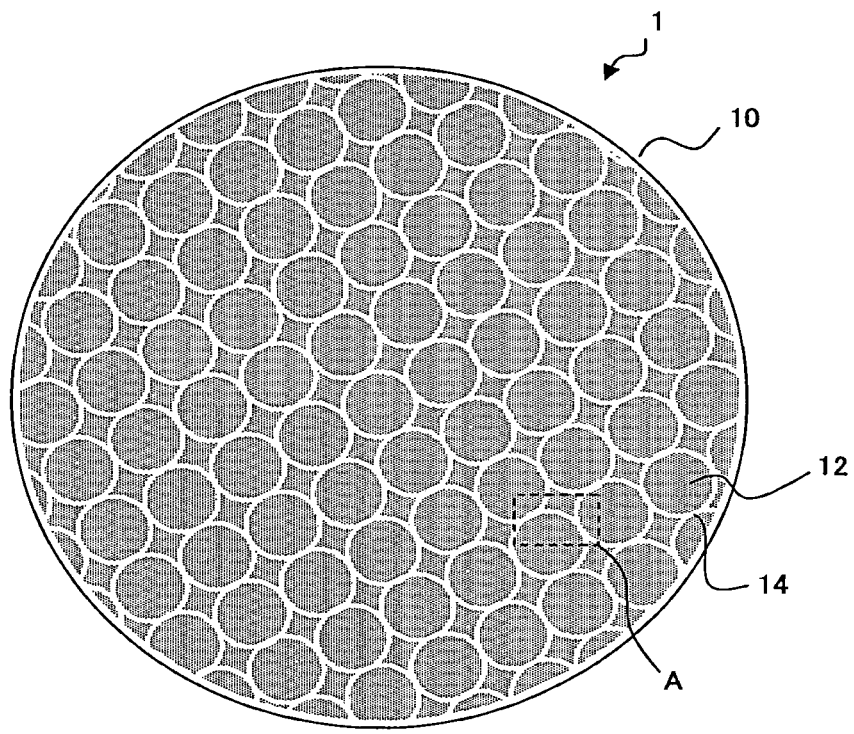
Figure 2A:
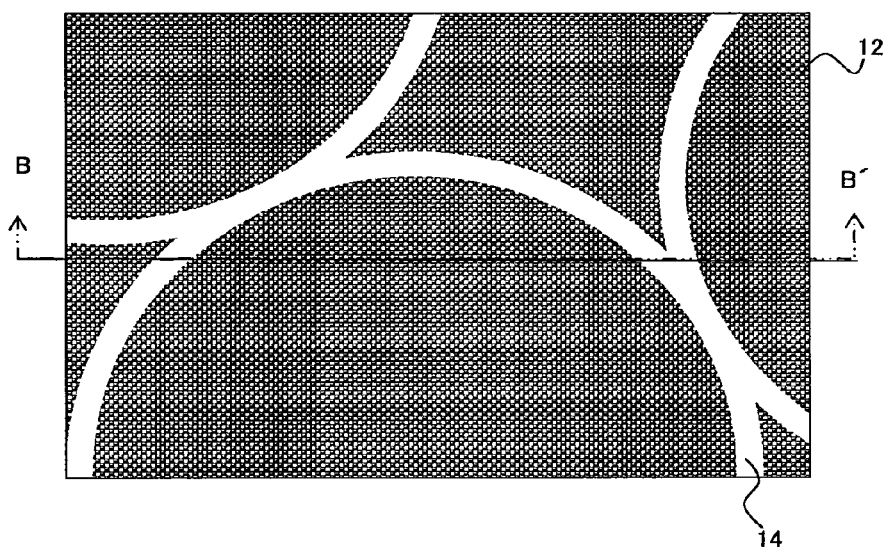
FIGS. 2A and 2B are enlarged views of part of the perforated support plate.
Figure 2B:
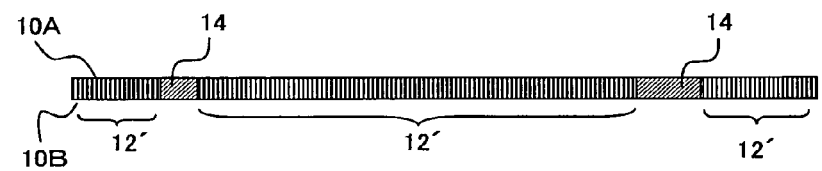

FIGS. 1 and 2 are explanatory views of a perforated support plate in a first embodiment of the present invention. FIG. 1A is a perspective view of the perforated support plate, whereas FIG. 1B is a top view of the perforated support plate. FIG. 2A is an enlarged view of the part enclosed with a dotted line A in FIG. 1B, whereas FIG. 2B is a cross-sectional view taken along a line B-B' in FIG. 2A.

The perforated support plate 1 illustrated in FIGS. 1A and 1B is configured by making many penetration holes 12 (represented with dots in these figures) of 0.4 mm in diameter over a plate base material 10 obtained by processing a plate glass material of 0.7 mm in thickness to be a circle of 300 mm in diameter.

The penetration holes 12 are formed, for example, by removing the glass substance from either or both sides of the plate base material 10 in the thickness direction with etching, etc. The penetration holes 12 are used as a passage for guiding a liquid toward the surface (the surface of the plate base material 10 illustrated in FIG. 1B) to be pasted to a wafer (not illustrated). As the liquid, a solvent of an adhesive member (such as an adhesive agent, etc.) not illustrated, which is interposed between the wafer and the plate base material 10 (on the surface of the plate base material 10 illustrated in FIG. 1B) and intended to paste the wafer and the plate base material 10, is used. Since this solvent is used to peel the plate base material 10 after the wafer is thinned, the penetration holes 12 may be made to penetrate the plate base material 10 when the plate base material 10 is peeled. In the following description, the penetration holes 12 are assumed to be holes that penetrate the plate base material 10 in the thickness direction. However, part of the glass substance may be left not to penetrate so that the penetration holes 12 can penetrate the plate base material immediately before the plate base material is peeled.

The plate base material 10 of the perforated support plate 1 has a structure where penetration holes are not arranged in a line portion 14 of a geometric pattern configured with a repetition of a circle. Further details of the structure of the above described line portion 14 of the geometric pattern are as represented by the enlarged view of the part illustrated in FIG. 2A, and the cross-sectional view illustrated in FIG. 2B. Namely, as illustrated in FIG. 2A, many penetration holes (black dots of FIG. 2A) 12 are arranged on the plate base material 10 almost evenly with high density. However, penetration holes are not arranged in the line portion (white thick lines of FIG. 2A) 14 of the geometric pattern. Moreover, as illustrated in FIG. 2B, many penetration holes 12 that penetrate from an upper surface 10A of the plate base material 10 into its lower surface 10B (thickness direction) are arranged in areas 12', and the glass substance is completely removed at the positions of the penetration holes 12 (portions represented with black stripes in FIG. 2B). However, since penetration holes are not arranged in the line portion 14 of the geometric pattern configured with the repetition of the circle, the glass substance that configures the plate base material 10 is left unchanged.

Examples of the size of the line portion 14 of the geometric pattern and that of the penetration holes 12 areas follows. Namely, the line of the geometric pattern is approximately 1 mm in width, the inner diameter of the circle is 29 mm, and the outer diameter of the circle is 31 mm. Additionally, the penetration holes 12 are approximately 0.4 mm in diameter, and arranged approximately with 0.6-mm pitches. The line of the geometric pattern has a predetermined width as described above. As illustrated in FIG. 2A, the line portion 14 of the geometric pattern separates the areas where the penetration holes 12 are provided in the form of an island.

In the configuration based on the above described numerical values, even a glass perforated plate base material of 300 mm in diameter and 0.7 mm in thickness does not deflect. This is because the glass substance left in the line portion 14 of the geometric pattern is formed as one-piece with the glass substance enclosing the penetration holes 12, acts to increase the rigidity of the plate base material 10, and functions as a reinforcing part for preventing the plate base material 10 from deflecting. Therefore, the area of the above described line portion 14 of the geometric pattern formed on the plate base material 10 is referred to as a reinforcing part or a no-hole area for deflection prevention in this specification.

The size of the diameter of the penetration holes 12 and their arrangement have a close relationship with the precision of pasting between the wafer and the plate base material 10, and the time required to peel the plate base material 10 from the wafer. Therefore, attention must be paid not to extend the peeling time while maintaining required deflection prevention effect if the reinforcing part is arranged. Currently, setting the line width of the reinforcing part to 1 mm or less is proved to be preferable in order to prevent the peeling time from extending.

The above described reinforcing part and penetration holes are formed on one plate base material 10 here. Therefore, both of them can be simultaneously formed. Namely, for example, a resist mask where positions at which the penetration holes 12 are formed are opened and an area functioning as a reinforcing part is not opened is laminated on the plate base material through a photolithography process step, the penetration holes are made to penetrate the plate base material through the opened part with anisotropic etching such as dry etching, etc., and the resist mask on the plate base material is removed. In this case, an area of 1 mm or less, which is represented with the line of the geometric pattern and left at a position from which the resist mask is removed last, is implemented as a reinforcing part.

The reinforcing part, namely, the no-hole area for deflection prevention formed on the plate base material is described above. However, the reinforcing part may be arranged not only as the no-hole area for deflection prevention but also as another form. For example, the rigidity can be increased also by preparing another reinforcing plate where an area except for the range represented by the above described line of the geometric pattern is opened or a plurality of penetration holes are arranged, and by providing the reinforcing plate by pasting it to a glass plate base material where penetration holes are opened on the entire surface.

As described above, the line portion of the circular geometric pattern is made not to penetrate the plate base material on the glass plate base material, and this line portion is implemented as a reinforcing part in the first embodiment.

By arranging the reinforcing part in the circular geometric pattern on the plate base material as described above, the strength of the surface can be increased over a wide range with high efficiency.

Furthermore, by arranging the reinforcing part in the circular geometric pattern on the entire surface of the plate base material, the rigidity of the entire surface of the plate base material can be increased. The glass plate base material of 300 mm in diameter and 0.7 mm in thickness can be prevented from deflecting, and availability to a pasting device and a peeling device is improved. In this case, the thickness of the glass plate base material is the same as that of a plate of less than 300 mm in diameter and 0.7 mm in thickness. Therefore, perforated support plates of large and small diameters can be similarly used without significantly changing the configuration of, for example, the pasting device, the peeling device etc., and without significantly increasing the number of components.

Additionally, the thickness of the plate base material on which the reinforcing part, namely, the no-hole area for deflection prevention is configured as described above is the same as that of the reinforcing part. Therefore, the perforated support plate and the plate base material can be made identical in thickness.

Furthermore, by implementing the line width of the above described geometric pattern to be 1 mm or less, a difference between a pitch of penetration holes and a pitch of penetration holes adjacent via the reinforcing part for deflection prevention is reduced. Therefore, the time required to peel the perforated support plate from the wafer, which is increased by providing the reinforcing part for deflection prevention, can be decreased.

Still further, since the no-hole area for deflection prevention is formed when the penetration holes are opened, the number of man-hours required to manufacture the perforated support plate does not increase.

(Second Embodiment)

The second embodiment refers to a perforated support plate used in a suction device type of vacuum-sucking and holding one side.

Figure 3A:
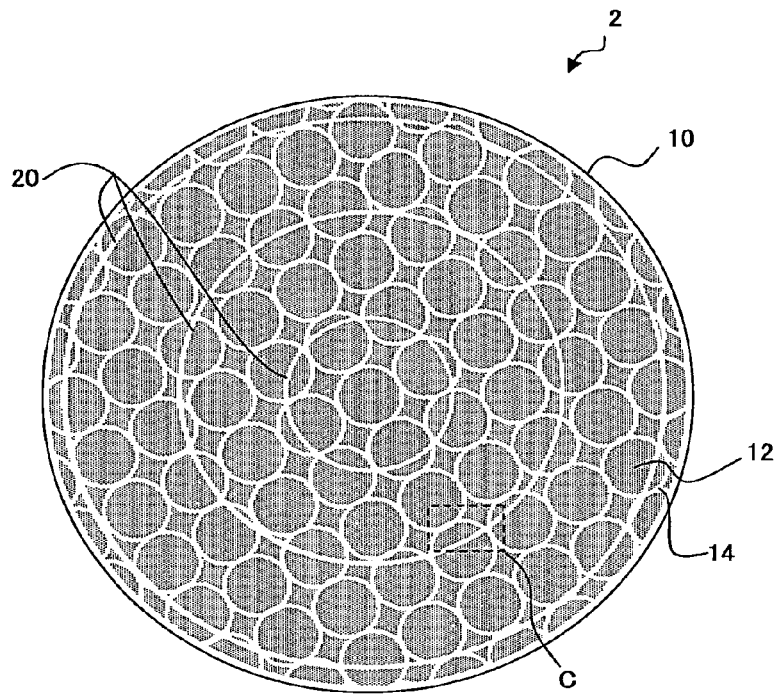
FIGS. 3A and 3B are explanatory views of a perforated support plate in a second embodiment of the present invention.
Figure 3B:
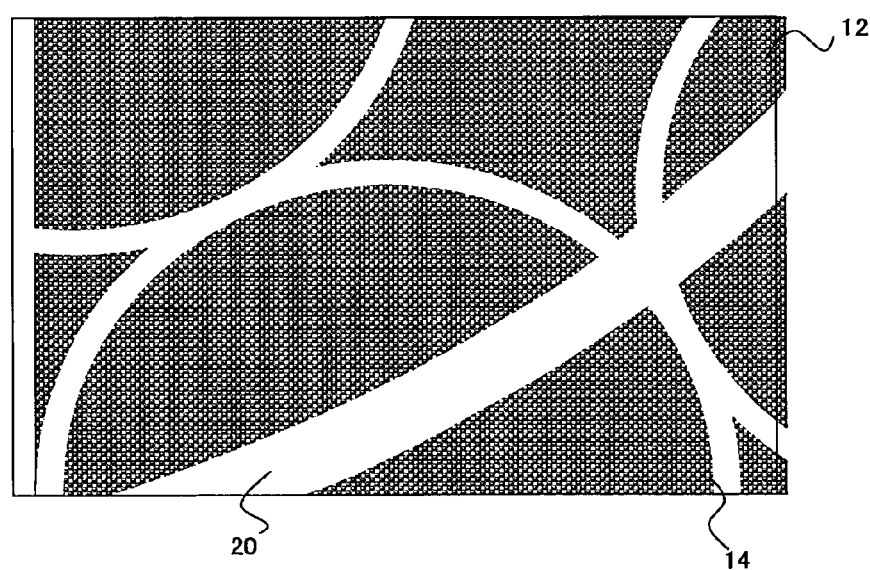

FIG. 3A is a top view of the perforated support plate in the second embodiment, whereas FIG. 3B is an enlarged view of the part C represented with a dotted line in FIG. 3A. In FIGS. 3A and 3B, the same components as those in FIG. 1B or 2A are denoted with the same reference numerals.

Differences from the first embodiment are described in detail below.

The perforated support plate 2 of FIGS. 3A and 3B is manufactured by processing the glass plate base material 10 of 0.7 mm in thickness to be a circle of 300 mm in diameter in a similar manner as in the first embodiment. A plurality of penetration holes 12 of approximately 0.4 mm in diameter are arranged on the entire surface with high density.

Unopened areas for suction 20 are further formed on the plate base material 10. Each unopened area for suction 20 is configured to be applied with a high negative pressure by evacuation from a vacuum suction device having a vacuum chuck, etc. Therefore, the unopened area for suction 20 is arranged to align with the position of a groove or hole for suction arranged in the vacuum suction device, and its arrangement and shape are determined according to a design of the vacuum suction device. The unopened areas for suction 20 are arranged as represented with a plurality of concentric circles illustrated in FIG. 3A. The unopened areas for suction 20 are structured at least not to penetrate the plate base material so that the air does not escape to the upper and the lower surfaces of the plate base material 10. Examples of the structure include a structure where the upper and the lower surfaces are blocked, and a structure having a shielding part partially in the thickness direction of the plate base material. The unopened area for suction 20 does not have penetration holes as described above, and totally different from the reinforcing part in terms of a position at which the unopened area for suction 20 is formed, an area where the unopened area for suction 20 is formed, and its function and specific structure.

In terms of the area where the unopened area for suction 20 is formed, the unopened area for suction 20 and the no-hole area for deflection prevention 14 are mutually different, for example, in line width. In FIG. 3B, the line width of the no-hole area for deflection prevention 14 is formed to be narrower than that of the unopened area for suction 20. Examples of the numerical data of the line widths for comparison purpose are as follows. Namely, each penetration hole 12 is arranged to be approximately 0.4 mm in diameter with approximately 0.6-mm pitches, and the line 14 of the geometric pattern configured with the repetition of the circle is arranged to be approximately 0.7 mm in width, with the inner diameter of 29.5 mm of the circle, and the outer diameter of 30 mm of the circle. The lines of the concentric circles configuring the unopened area for suction 20 are arranged to be approximately 1 mm in width. However, since the unopened area for suction 20 must be arranged to block the suction groove or hole of the vacuum suction device, it is preferable to form the line width to be at least 0.5 mm or more to suit the suction groove or hole of the vacuum suction device.

In the second embodiment, a portion (common area) where the unopened area for suction 20 and the no-hole area for deflection prevention 14 overlap occurs. In this common area, two objects to reinforce the plate base material without degrading the sucking property of the vacuum suction device must be achieved. Therefore, the common area is configured as the no-hole area for deflection prevention 14.

The unopened area for suction 20 and the no-hole area for deflection prevention 14 can be formed simultaneously with the process step of forming the penetration holes 12 as follows. Namely, these areas can be formed, for example, by laminating a resist mask, on which positions at which the penetration holes 12 are formed are opened and positions corresponding to the unopened area for suction 20 and the no-hole area for deflection prevention 14 are unopened, on the glass plate base material 10 through a photolithography process step by making the penetration holes penetrate the plate base material 10 via the opened part with anisotropic etching such as dry etching, and by removing the resist mask on the plate base material 10 last. In this case, an area of, for example, 0.7 mm or less, which is represented with the line of the geometric pattern in the area left at a position from which the resist mask is removed last, is implemented as the no-hole area for deflection prevention 14, and an area of, for example, 1 mm or more, which is represented with the line of the concentric circle, is implemented as the unopened area for suction 20.

As described above, in the second embodiment, the unopened area for suction 20 is further provided on the plate base material referred to in the first embodiment. Since the unopened area for suction 20 is provided on the perforated support plate in the second embodiment, its sucking property is superior to that of the perforated support plate 1 referred to in the first embodiment. Moreover, especially, the no-hole area for deflection prevention 14 includes the area (common are) that overlaps the unopened area for suction 20, but penetration holes are not configured in the common area. Therefore, effects similar to the perforated support plate 1 in the first embodiment can be also obtained.

(Third Embodiment)

The third embodiment refers to modification examples of the reinforcing part (especially, the no-hole area for deflection prevention) and the unopened area for suction, which are configured on the perforated support plates referred to in the first and the second embodiments. Assume that the no-hole area for deflection prevention and the unopened area for suction are provided under the conditions referred to in the second embodiment although this is not particularly described below.

FIGS. 4 and 5 illustrate modification examples of the line of the circular geometric pattern of the reinforcing part referred to in the first embodiment (or the no-hole area for deflection prevention referred to in the second embodiment).

FIG. 4 is an example of a case where the above described line of the circular geometric pattern is changed to a line of a polygonal geometric pattern. The reinforcing part (or the no-hole area for deflection prevention) is configured with a line 30 of a geometric pattern as a repetition of a hexagonal pattern.

FIG. 5 is an example of a case where the above described line of the circular geometric pattern is changed to a line of a geometric pattern configured with a combination of a plurality of concentric circles. The reinforcing part (or the no-hole area for deflection prevention) is configured with lines 40 of six concentric circles of different diameters.

Figure 8:
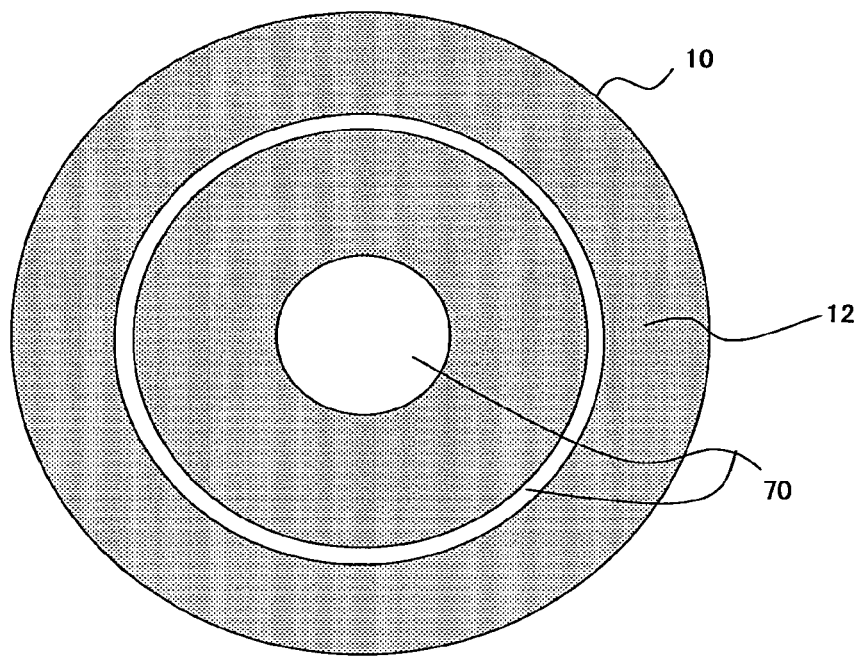
FIG. 8 is a schematic diagram (No. 3) illustrating a modification example of the shape of the unopened area for suction.

FIGS. 6 to 8 illustrate examples of transforming the shape of the concentric circles of the unopened area for suction referred to in the second embodiment. Each shape is transformed according to the position of a groove or hole for suction configured in the vacuum suction device.

FIG. 6 is an example of a case where the unopened area for suction is provided in the form of an island. Here, elliptical unopened areas for suction 50 are provided at four positions equally distant from the center as illustrated in FIG. 6.

FIG. 7 is an example of a case where the unopened area for suction is provided as mutually orthogonal two band-like lines 60.

FIG. 8 is an example of a case where the unopened area for suction is provided by forming the central part and an outer area respectively as an island and a line 70 of a concentric circle.

The patterns of the reinforcing part (or the no-hole area for deflection prevention) are merely examples. Therefore, the pattern of the reinforcing part (or the no-hole area for deflection prevention) may be configured with a line of another geometric pattern. For example, the line of the geometric pattern may be configured by using only one circle or polygon.

Also the above described shapes of the unopened area for suction are merely examples. Accordingly, the shape of the unopened area for suction can be suitably transformed according to the groove or hole for suction configured in the vacuum suction device.

Additionally, on the perforated support plate used in a suction device type of vacuum-sucking and holding one side, the pattern of the no-hole area for deflection prevention and the shape of the unopened area for suction can be configured by arbitrarily combining the above described patterns and shapes.

As described above, the reinforcing part can be configured in various patterns in the third embodiment. Accordingly, an optimum pattern can be selected in terms of the material and the design of a plate base material. Moreover, the pattern of the no-hole area for deflection prevention and the shape of the unopened area for suction can be configured by combining various patterns and shapes. As a result, a perforated support plate with high sucking property and high rigidity can be suitably selected according to a configuration of a vacuum suction device.

Also the effects referred to in the first and the second embodiments can be obtained.

The invention claimed is:

1. A method of reinforcing a wafer, comprising:
   providing a support plate,
      wherein the support plate comprises a reinforcing part, a plurality of penetration holes and an unopened area for suction,
      wherein the reinforcing part is a first no-hole area for deflection prevention that is formed on the support plate and configured with a geometric pattern,
      wherein the plurality of penetration holes are formed on the support plate such that each of the plurality of penetration holes penetrates the support plate, and
      wherein the unopened area for suction provided on the support plate is a second no-hole area that does not allow air to escape when vacuum suctioning the support plate;
   aligning a vacuum suction device with a position of a groove and/or hole for suction on the unopened area for suction on the support plate; and
   adhering the support plate to a wafer with an adhesive layer.

2. The method of reinforcing a wafer of claim 1,
   wherein the geometric pattern is configured with a plurality of concentric circles, lines extending radially, or a repetition of a same graphic.

3. The method of reinforcing a wafer of claim 2,
   wherein a line width of the geometric pattern is 1 mm or less.

4. The method of reinforcing a wafer of claim 2, further comprising:
   holding the support plate by vacuum suctioning while thinning the wafer;
   introducing a solvent that dissolves the adhesive layer between the support plate and the wafer, wherein the plurality of penetration holes guide the solvent to the adhesive layer through the support plate; and peeling the support plate from the wafer.

5. The method of reinforcing a wafer of claim 1,
wherein a line width of the geometric pattern is 1 mm or less.

6. The method of reinforcing a wafer of claim 1,
wherein the support plate is approximately 300 mm in diameter and 0.7 mm or less in thickness.

7. The method of reinforcing a wafer of claim 1,
wherein the plurality of penetration holes are each approximately 0.4 mm in diameter and are arranged on the support plate to offer approximately 0.6 mm pitches, and
wherein the reinforcing part is configured with the line of the geometric pattern on the support plate and reinforces the strength of the surface of the support plate, the line of the geometric pattern separates the penetration holes into island-formed areas, and a line width of the geometric pattern is 1 mm or less.

8. A method of reinforcing a wafer, comprising:
providing a support plate,
wherein the support plate comprises a reinforcing part and a plurality of penetration holes,
wherein the reinforcing part is a first no-hole area for deflection prevention that is formed on the support plate and configured with a geometric pattern configured with a plurality of concentric circles, lines extending radially, or a repetition of a same graphic, and
wherein the plurality of penetration holes are formed on the support plate such that each of the plurality of penetration holes penetrates the support plate; and adhering the support plate to a wafer with an adhesive layer.

9. The method of reinforcing a wafer of claim 8,
wherein a line width of the geometric pattern is 1 mm or less.

10. The method of reinforcing a wafer of claim 8,
wherein the support plate is approximately 300 mm in diameter and 0.7 mm or less in thickness.

11. The method of reinforcing a wafer of claim 8,
wherein the plurality of penetration holes are each approximately 0.4 mm in diameter and are arranged on the support plate to offer approximately 0.6 mm pitches, and
wherein the reinforcing part is configured with the line of the geometric pattern on the support plate and reinforces the strength of the surface of the support plate, the line of the geometric pattern separates the penetration holes into island-formed areas, and a line width of the geometric pattern is 1 mm or less.

12. The method of reinforcing a wafer of claim 8, further comprising:
holding the support plate by vacuum suctioning while thinning the wafer;
introducing a solvent that dissolves the adhesive layer between the support plate and the wafer,
wherein the plurality of penetration holes guide the solvent to the adhesive layer through the support plate; and peeling the support plate from the wafer.

13. A method of reinforcing a wafer, comprising:
providing a support plate,
wherein the support plate comprises a reinforcing part and a plurality of penetration holes,
wherein the reinforcing part is a first no-hole area for deflection prevention that is formed on the support plate and configured with a geometric pattern,
wherein the plurality of penetration holes are formed on the support plate such that each of the plurality of penetration holes penetrates the support plate
wherein the plurality of penetration holes are each approximately 0.4 mm in diameter and are arranged on the support plate to offer approximately 0.6 mm pitches, and
wherein the reinforcing part is configured with the line of the geometric pattern on the support plate and reinforces the strength of the surface of the support plate, the line of the geometric pattern separates the penetration holes into island-formed areas, and a line width of the geometric pattern is 1 mm or less; and adhering the support plate to a wafer with an adhesive layer.

14. The method of reinforcing a wafer of claim 13,
wherein the geometric pattern is configured with a plurality of concentric circles, lines extending radially, or a repetition of a same graphic.

15. The method of reinforcing a wafer of claim 14, further comprising:
holding the support plate by vacuum suctioning while thinning the wafer;
introducing a solvent that dissolves the adhesive layer between the support plate and the wafer,
wherein the plurality of penetration holes guide the solvent to the adhesive layer through the support plate; and peeling the support plate from the wafer.

16. The method of reinforcing a wafer of claim 13,
wherein the support plate is approximately 300 mm in diameter and 0.7 mm or less in thickness.

* * * * *